United States Patent [19]
Olivo et al.

[11] Patent Number: 4,956,569
[45] Date of Patent: Sep. 11, 1990

[54] CMOS LOGIC CIRCUIT FOR HIGH VOLTAGE OPERATION

[75] Inventors: Marco Olivo, Bergamo; Luigi Pascucci, Sesto S. Giovanni; Carlo Riva; Paolo Rosini, both of Monza; Corrado Villa, Sovico, all of Italy

[73] Assignee: SGS-Thomson Microelectronics S.R.L., Italy

[21] Appl. No.: 373,203

[22] Filed: Jun. 30, 1989

[30] Foreign Application Priority Data

Jul. 6, 1988 [IT]  Italy ................ 83646 A/88

[51] Int. Cl.$^5$ ............................................ H03K 17/10
[52] U.S. Cl. .................................... 307/443; 307/451; 307/272.2; 307/296.5; 365/189.09; 365/226
[58] Field of Search ............. 365/189.09, 226, 230.06; 307/443, 449, 451, 463, 272.2, 296.5, 475

[56] References Cited

U.S. PATENT DOCUMENTS

| | | | |
|---|---|---|---|
| 4,441,172 | 4/1984 | Ebel | 365/189.09 X |
| 4,490,629 | 12/1984 | Barlow et al. | 307/451 |
| 4,565,932 | 1/1986 | Kuo et al. | 365/226 X |
| 4,689,504 | 8/1987 | Rughurathan et al. | 307/449 |
| 4,704,547 | 11/1987 | Kirsch | 307/451 X |
| 4,736,117 | 4/1988 | Weiser | 307/451 X |
| 4,740,713 | 4/1988 | Sakurai et al. | 307/296.5 X |
| 4,820,941 | 4/1989 | Dolby et al. | 365/226 X |
| 4,835,423 | 5/1989 | deFerron et al. | 365/226 X |
| 4,845,381 | 7/1989 | Cuevas | 365/226 X |
| 4,893,275 | 1/1990 | Tanaka et al. | 365/189.09 |

*Primary Examiner*—David Hudspeth
*Attorney, Agent, or Firm*—Wenderoth, Lind & Ponack

[57] ABSTRACT

A CMOS logic circuit for converting a low voltage logic signal with a range O-VCC into a high voltage logic signal with a range O-VPP, which may be entirely made with enhancement-type transistors, comprises an additional p-channel, decoupling transistor functionally connected in series with the p-channel transistor of the CMOS circuit which is connected to the high voltage node VPP and the additional decoupling transistor is driven by a bias voltage tied to the VPP voltage and lower than the latter by a certain preset value. The so-called gated breakdown of p-channel transistors is effectively prevented and furthermore these circuits, destined to operate under a high supply voltage, may be fabricated through a normal CMOS fabrication process not requiring particular fabrication techniques for the p-channel transistors subject to gated breakdown conditions or the formation of depletion-type transistors and without the use of special circuits which require oscillator generated driving signals.

4 Claims, 1 Drawing Sheet

CMOS LOGIC CIRCUIT FOR HIGH VOLTAGE OPERATION

BACKGROUND OF THE INVENTION

1. Field of the invention

The present invention relates to CMOS integrated circuits operating at relatively high voltage and, in particular, to a circuit arrangement for protecting p-channel transistors from the "gated breakdown" phenomenon.

2. Description of the prior art

In EEPROM and EPROM memory devices, particular circuits are often implemented for converting a logic signal having a range 0-VCC in a logic signal having a range 0-VPP, where VCC is the supply voltage of the general circuitry whereas VPP is a relatively high supply voltage (generated outside or inside the integrated device by means of a suitable voltage multiplier) used in programming circuits of the nonvolatile memory cells. Such a VPP voltage is normally much higher than VCC and often creates problems of junction breakdown particularly difficult to overcome when the fabrication process of the device is not designed for high voltage withstanding.

In general CMOS logic circuits are characterized by having pairs of p-channel and n-channel transistors connected in series between the supply rail and the ground rail of the circuit in order to have a current flow only on transitions while in steady state conditions one or the other of the two, opposite polarity transistors is cut off and prevents the flow of current (energy dissipation).

Going back to the specific problem raised by the necessity of utilizing a high level (VPP) supply voltage within limited portions of the CMOS integrated circuit, such a problem may be easily described for the case of an inverter (FIG. 1), wherein the output signal is the negative of the input signal, and for the case of a latch (FIG. 2), wherein the input signal is stored and the output signal is available in a direct as well as in a complementary form. These circuits may be considered representative of CMOS logic circuitry.

Usually the operation of these circuits at a relatively high voltage (VPP) contemplates that switching occur when VCC=VPP, after the VPP increases, more or less gradually to a maximum asymptotic value which is maintained for a period during which no switching occurs. During the raising of the VPP voltage, one or more junctions of the integrated circuit may reach their breakdown voltage causing malfunctioning of transistors.

The inverter of FIG. 1 operates as follows. When the input IN is low, the node A is similarly low because the transistor P2 is usually much more resistive than the driver (not shown in the figure) which drives the signal applied to the input IN, and therefore the voltage at the output OUT rises to a VPP value (which at the transition instant is equal to the supply voltage VCC of the general circuitry), thus cutting-off the transistor P2 and confirming the logic zero on the node A. When the input IN becomes high (i.e. is forced to the VCC level), on the node A a maximum voltage equal to the supply voltage VCC less the threshold of the transistor N3 is obtained, and if this voltage raises beyond the threshold value of the inverter, the output OUT drops to zero, causing conduction of transistor P2 and also bringing the node A to the VPP level. In this way power consumption under steady state is prevented because all the nodes of the circuit assume "full" voltage values, i.e. zero or VCC=VPP. The transistor N3 is employed for decoupling the two supply voltages VCC and VPP when the latter starts to rise toward its set asymptotic level. In fact, being the gate of the transistor N3 biased at a constant value equal to VCC, when the voltage on node A rises following the rise of the VPP voltage from a VCC value to its maximum value, no current flow may take place from node A toward node IN because the Vgs (gate-sorce voltage) of the transistor N3 is equal to zero.

The latch circuit of FIG. 2 operates substantially in a way similar to that of the inverter circuit of FIG. 1, with the difference that the transistor N3 is made conducting by means of an appropriate sampling signal which is applied to the relative terminal only when the signal present at the input terminal IN of the circuit must be sampled, after which the latter signal remains stored in the circuit also after transistor N3 is cut off, being confirmed to a logic value "0" or to the logic value "1" by means of the transistor N4 or the transistor P2, respectively.

In both circuits the junctions of the p-channel transistors P2 and P1 may be subject to breakdown when the voltage VPP assumes its maximum value (gated breakdown).

A solution which is commonly resorted to for overcoming the gated breakdown problem of p-channel transistors is the so called "charge pump load". This circuit is depicted in FIG. 3 and utilizes only n-channel transistors and requires a timimg signal (phase) and therefore an oscillator for generating the latter for pumping electric charge on the output node OUT through the capacitor C and the diode connected transistor D1. Another disadvantage is that the output voltage is affected by the thresholds of the transistors D1 and T1 and becomes dependent also from the ratio between the capacitance C and the parasitic capacitance C' toward the substrate.

In CMOS circuits of the prior art p-channel transistors which are subject to the VPP voltage must necessarily be provided with implanted drain-extension regions and, more in general, special processing techniques must be resorted to in order to make these p-channel transistors capable of withstanding such a high voltage (VPP).

SUMMARY OF THE INVENTION

The circuit object of the present invention provides a technique for preventing gated breakdown of junctions of p-channel transistors subject to a relatively high supply voltage VPP in these CMOS circuits, while permitting the use of a normal CMOS fabrication process not requiring the realization of drain-extension implantations in p-channel transistors and not requiring the use of oscillators for pumping electric charge.

Essentially the circuit of the invention employs a p-channel decoupling transistor connected substantially in series with the p-channel transistor of the CMOS circuit, be the latter for instance an inverter or a latch, for effectively preventing breakdown. This additional decoupling transistor is driven by a dedicated signal which may advantageously be a fraction of the VPP supply voltage suitably derived therefrom by means of a plurality of diodes or of diode-connected transistors connected in series between the VPP node and the gate of such a decoupling transistor.

DESCRIPTION OF PREFERRED EMBODIMENT

Figure 1:
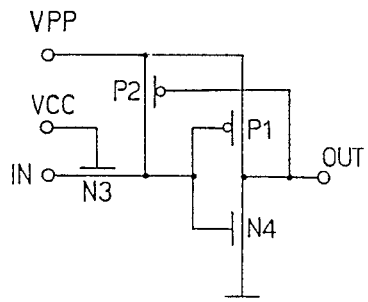
FIG. 1 is a basic diagram of a CMOS inverter for converting a low voltage logic signal (range 0-Vcc) into a high voltage logic signal (range 0-Vpp).
Figure 2:
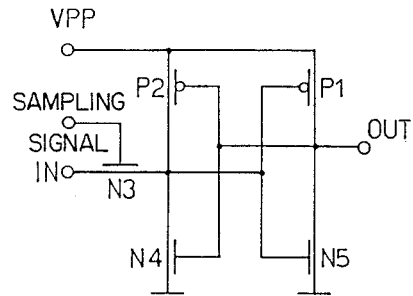
FIG. 2 is a basic diagram of a CMOS latch capable of converting a low voltage logic signal (0-VCC) into a high voltage logic signal (range 0-VPP).
Figure 3:
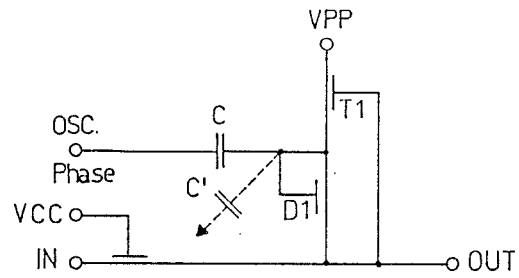
FIG. 3 is a circuit diagram of an alternative circuit for converting a low voltage logic signal (range 0-VCC) into a high voltage logic signal (range 0-Vpp) of the charge-pump type which utilizes an oscillator signal according to prior art.
Figure 4:
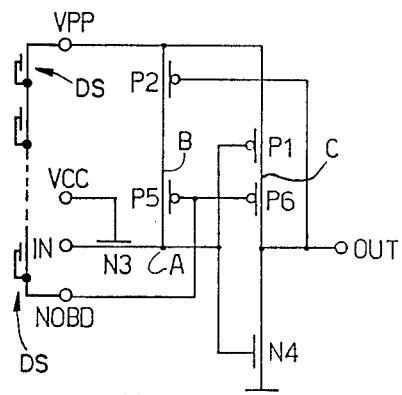
FIG. 4 is a circuit diagram of a CMOS inverter for high voltage operation in accordance with the present invention.
Figure 5:
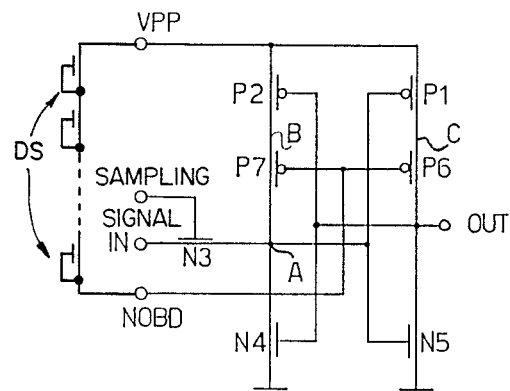
FIG. 5 is a circuit diagram of a CMOS latch for operation at high voltage in accordance with the present invention.

By comparing the annexed figures it may be easily observed that the inverter for operation at high voltabe of the present invention depicted in FIG. 4 shows a basic diagram substantially similar to the basic diagram of the prior art inverter depicted in FIG. 1 with the exception of the two additional p-channel transistors P5 and P6; similarly the latch for high voltage operation of the present invention depicted in FIG. 5 has a basic diagram which is substantially similar to the basic diagram of the prior art latch depicted in FIG. 2 with the exception of the two additional p-channel transistors P6 and P7.

In both instances, decoupling additional p-channel transistors (P5 and P6 in the case of the inverter of FIG. 4 and P7 and P6 in the case of the latch of FIG. 5) are connected in series with the p-channel transistors which are connected to the high voltage supply node VPP (P2 and P1). These decoupling p-channel additional transistors are driven through a dedicated terminal NOBD.

Assuming the transistor P1 of the inverter of FIG. 4 or of the latch of FIG. 5 as having having a gated breakdown voltage of 13 V, as typically exhibited by such transistors made by a normal CMOS process, and that the value reached by the VPP supply voltage be 18 V, in this condition the prior art circuits would be useless without the adoption of special fabrication techniques for the p-channel transistors, because, when IN = VCC, the node A assumes the VPP voltage and the output OUT drops to zero, thus placing the transistor P1 under gated breakdown conditions being its source and gate at the VPP voltage and its drain at null voltage. On the contrary, when the input IN is at null voltage (ground) the transistor P2 could find itself under gated breakdown conditions.

In the CMOS circuits of FIG. 4 and of FIG. 5 made in accordance with the present invention, during the period when VPP = VCC, the NOBD terminal potential is suitably forced to ground so that the relative p-channel "pass-transistors" (P5 and P6 in FIG. 4 and P7 and P6 in FIG. 5) are ON and the overall behaviour of each circuit is functionally identical to that described before for the respective circuits of the prior art without the decoupling transistors (FIG. 1 and FIG. 2 respectively).

When the VPP voltage rises toward its maximum asymptotic value, also the voltage of the NOBD terminal may be easily made to trail the VPP voltage by maintaining a certain potential difference between the VPP voltage and the NOBD terminal voltage for example by connecting the NOBD terminal to the VPP node through a series of diodes e.g. of diode-connected transistors DS as shown in FIGS. 4 and 5. The voltage applied to the NOBD terminal may have, for example, a value equal to VPP−10 V, whereby, under steady conditions, a voltage equal to: 18−10 = 8 V is applied to the NOBD terminal.

Figure 6:
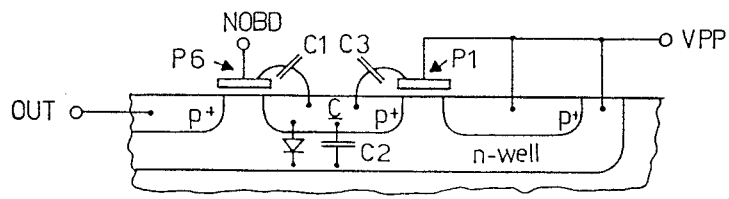
FIG. 6 is a simplified portion of a CMOS circuit made in accordance with the present invention wherein significative circuit components are brought in evidence.

Structurally the CMOS circuit of the invention is depicted in the cross section shown in FIG. 6. The n-well of the p-channel transistors P1 and P6, shown in the partial cross section of FIG. 6, is common and is connected to the VPP voltage. The C diffusion corresponding to the C node of the circuits depicted in FIGS. 4 and 5, is capacitively coupled through the capacitances C1, C2 and C3 to the gate of the transistor P6, to the n-well and to the gate of the transistor P1, respectively and, as observed before, the NOBD terminal is forced to ground potential before the VPP voltage begins to rise to its maximum asymptotic value. When both the VPP voltage and the NOBD terminal voltage rise, also the potential of the C diffusion rises, the value thereof being given by the following expression:

$$VNOBD\ C1+VPP\ C2/C1+C2+C3;$$

as long as the diffusion remains substantially floating. Whenever the potential of such a C diffusion (C node of the depicted circuits) becomes greater than the voltage of the NOBD terminal increased by a voltage equal to the threshold of the transistor P6, the latter would start to conduct and to drag the potential of the C node toward the potential of the output node OUT, i.e. to ground, with the ultimate effect of cutting off itself. Therefore the C node maintains itself at a voltage which cannot become greater than the sum of the NOBD voltage and of the p-channel transistor threshold voltage. In practice the C node voltage does not drop substantially below the sum of the NOBD voltage and of the p-channel threshold voltage because of the leakage of the p+/n-well junction, and cannot rise above such a value because of the attendant turning ON of the transistor P6. Even though the leakage of the C diffusion may not be capable of positively preventing the potential of the node itself to drop and therefore to reach a breakdown condition, the resulting breakdown will immediately bring back the diffusion, i.e. the C node, to the above-noted operating voltage. Such a breakdown would not be a destructive breakdown because it is not supported by any constant current. In this situation, the transistor P1 cannot ever reach the critical conditions of the so-called gated breakdown because its drain is no longer at ground potential as it would without the presence of the coupling transistor P6 but, for instance, at about 9 V.

Of course the breakdown condition cannot be reached by the additional decoupling p-channel transistor P6 either, which has voltages similarly lower than the critical values applied to its terminals.

The same considerations may be made also for the p-channel transistors P2 and P5 of the inverter of FIG. 4 and for the transistors P2 and P7 of the latch of FIG.

5; the B node shown in the two figures coinciding with a p+ diffusion substantially identical to the C diffusion shown in the partial cross section of FIG. 6.

As it will be evident to the skilled technician, the decoupling circuit arrangement of the present invention may be used in CMOS circuits every time there is a danger of originating a gated breakdown, i.e. in presence of relatively high supply voltages and when a normal CMOS fabrication process unable to produce p-channel type devices capable of withstanding relatively high voltage must be employed.

What we claim is:

1. A CMOS logic circuit employing solely enhancement-type transistors and comprising at least a network formed by a first p-channel transistor and a second n-channel transistor functionally connected in electrical series between a high voltage supply VPP, on which a VPP voltage gradually develops in an asymptotic way starting from a minimum value equal to a supply voltage VCC following a transition of the circuit and during a period subsequent thereto, and a ground rail of the circuit, an output node between said series-connected transistors on which producing a high voltage logic signal having a range between zero and VPP and which is a replica of a low voltage logic signal, having a range between zero and VCC, applied to the gates connected in common of said first and second transistors, and characterized by comprising means for preventing a gated breakdown of said p-channel transistor constituted substantially by a third p-channel transistor, functionally connected between said first p-channel transistor and said intermediate output node, said third p-channel transistor having a gate which is forced to ground potential when said VPP voltage maintains itself equal to said VCC voltage and which is biased at a voltage lower than said VPP voltage by a constant preset value when said VPP voltage rises to an asymptotic maximum value thereof.

2. A circuit according to claim 1, wherein the gate of said third p-channel transistor is connected to said high voltage node VPP through a bias network which comprises a series of diode-connected transistors.

3. A circuit according to claim 1, wherein said logic circuit is an inverter.

4. A circuit according to claim 1, wherein said logic circuit is a latch.

* * * * *